(12) United States Patent
Zhao

(10) Patent No.: US 11,925,050 B2
(45) Date of Patent: Mar. 5, 2024

(54) METHOD OF MANUFACTURING DISPLAY PANEL

(71) Applicant: WUHAN CHINA STAR OPTOELECTRONICS SEMICONDUCTOR DISPLAY TECHNOLOGY CO., LTD., Hubei (CN)

(72) Inventor: Lei Zhao, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 840 days.

(21) Appl. No.: 16/964,807

(22) PCT Filed: Nov. 22, 2019

(86) PCT No.: PCT/CN2019/120104
§ 371 (c)(1),
(2) Date: Jul. 24, 2020

(87) PCT Pub. No.: WO2021/042580
PCT Pub. Date: Mar. 11, 2021

(65) Prior Publication Data
US 2023/0165035 A1     May 25, 2023

(30) Foreign Application Priority Data
Sep. 2, 2019   (CN) .......................... 201910822594.7

(51) Int. Cl.
H10K 50/844   (2023.01)
H10K 71/00    (2023.01)

(52) U.S. Cl.
CPC .......... *H10K 50/844* (2023.02); *H10K 71/00* (2023.02)

(58) Field of Classification Search
None
See application file for complete search history.

(56) References Cited

U.S. PATENT DOCUMENTS

| 2014/0049742 | A1 | 2/2014 | Misono |
| 2019/0363296 | A1 | 11/2019 | Wang et al. |
| 2023/0015124 | A1* | 1/2023 | Ryu .................. G02F 1/133305 |

(Continued)

FOREIGN PATENT DOCUMENTS

| CN | 104576698 A | 4/2015 |
| CN | 105845845 A | 8/2016 |
| CN | 106374057 A | 2/2017 |

(Continued)

*Primary Examiner* — Michael Lebentritt
(74) *Attorney, Agent, or Firm* — PV IP PC; Wei Te Chung; Zhigang Ma

(57) ABSTRACT

A method of manufacturing a display panel includes fabricating a display portion on a glass substrate; adhering a protection film on the glass substrate outside the display portion, and the protection film having an opening accommodating the display portion; forming an encapsulation film on the protection film and the display portion; and obtaining a panel area by removing the protection film and the encapsulation film outside a predetermined limited area on the glass substrate. The predetermined limited area corresponds to the display portion.

15 Claims, 3 Drawing Sheets

(56) References Cited

U.S. PATENT DOCUMENTS

| | | | |
|---|---|---|---|
| 2023/0029503 A1* | 2/2023 | Chae | H01L 25/0753 |
| 2023/0037058 A1* | 2/2023 | Paek | H10K 71/851 |

FOREIGN PATENT DOCUMENTS

| | | | | |
|---|---|---|---|---|
| CN | 106684259 A | | 5/2017 | |
| CN | 106848093 A | | 6/2017 | |
| CN | 107742476 A | | 2/2018 | |
| CN | 108258149 A | | 7/2018 | |
| CN | 108511632 A | | 9/2018 | |
| CN | 108520921 A | | 9/2018 | |
| CN | 109609902 A | | 4/2019 | |
| CN | 110061148 A | | 7/2019 | |
| CN | 112133724 A | * | 12/2020 | B23K 26/064 |
| CN | 114551748 A | * | 5/2022 | H01L 51/5237 |
| CN | 114551757 A | * | 5/2022 | H01L 27/3244 |
| CN | 111200082 B | * | 8/2022 | H01L 27/3244 |
| CN | 114937680 A | * | 8/2022 | H01L 51/5237 |
| CN | 115605054 A | * | 1/2023 | |

\* cited by examiner

METHOD OF MANUFACTURING DISPLAY PANEL

BACKGROUND OF INVENTION

1. Field of Invention

The present invention relates to a technical field of displays, and particularly to, a method of manufacturing a display panel.

2. Related Art

Current organic light-emitting diode display panels are mainly encapsulated in a manner using first inorganic layers, organic layers, and second inorganic layers alternatively arranged, wherein the inorganic layers are generally formed by chemical vapor deposition (CVD) coating and the organic layers are formed by inkjet printing.

However, since masks are required during CVD processes, and reaction gases diffuse to edges during the CVD processes, bottoms of side walls of the second inorganic layers will extend outward, thereby adversely affecting characteristics of the edges of organic light-emitting diode (OLED) devices and resulting in an increase in frame sizes of display panels.

Therefore, it is imperative to provide a method of manufacturing a display panel to overcome the problem of the prior art.

SUMMARY OF INVENTION

An object of the present invention is to provide a method of manufacturing a display panel to reduce a frame size of the display panel.

In order to achieve the above-mentioned object, the present invention provides a method of manufacturing a display panel, comprising fabricating a display portion on a glass substrate; adhering a protection film on the glass substrate outside the display portion, wherein the protection film has an opening, the opening accommodates the display portion, and a distance between an inner edge of the protection film and the display portion is defined according to a predetermined frame width of the display panel; forming an encapsulation film on the protection film and the display portion; separating the protection film and the encapsulation film outside a predetermined limited area on the glass substrate from the protection film and the encapsulation film in the predetermined limited area; and obtaining a panel area by peeling away the protection film and the encapsulation film outside the predetermined limited area, wherein the predetermined limited area corresponds to the display portion.

The present invention further provides a method of manufacturing a display panel, comprising fabricating a display portion on a glass substrate; adhering a protection film on the glass substrate outside the display portion, wherein the protection film has an opening and the opening accommodates the display portion; forming an encapsulation film on the protection film and the display portion; obtaining a panel area by removing the protection film and the encapsulation film outside a predetermined limited area on the glass substrate, wherein the predetermined limited area covers the display portion.

A method of manufacturing a display panel of the present invention is implemented by fabricating a display portion on a glass substrate; adhering a protection film on the glass substrate outside the display portion, wherein the protection film has an opening and the opening accommodates the display portion; forming an encapsulation film on the protection film and the display portion; and obtaining a panel area by removing the protection film and the encapsulation film outside a predetermined limited area on the glass substrate, wherein the predetermined limited area corresponds to the display portion. Because a film formation area of inorganic layers is defined by adhering the protection film, outer edges of the inorganic layers can be prevented from expanding, thereby reducing a frame size of the display panel.

DESCRIPTION OF PREFERRED EMBODIMENTS

The following embodiments are referring to the accompanying drawings for exemplifying specific implementable embodiments of the present invention. Directional terms described by the present invention, such as upper, lower, front, back, left, right, inner, outer, side, etc., are only directions by referring to the accompanying drawings, and thus the used directional terms are used to describe and understand the present invention, but the present invention is not limited thereto.

Figure 1:
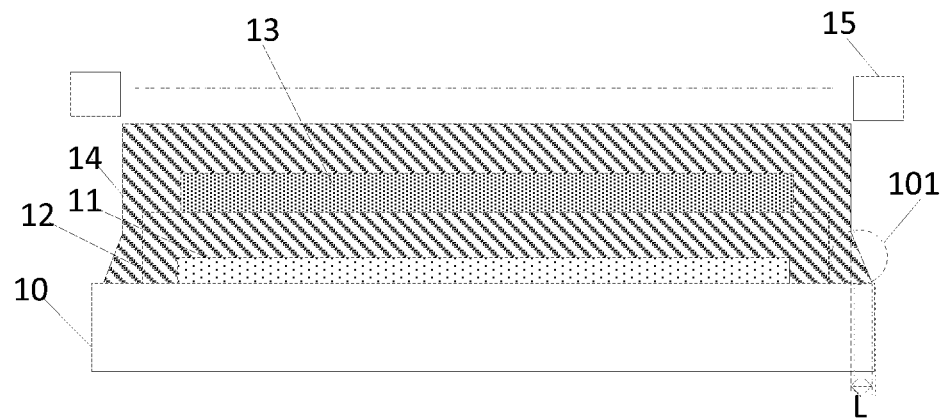
FIG. 1 is a schematic structural view of a conventional display panel.

As shown in FIG. 1, a conventional method of manufacturing a display panel includes sequentially forming a display portion 11, a first inorganic layer 12, an organic layer 13, and a second inorganic layer 14, wherein the first inorganic layer 12 and the second inorganic layer 14 are formed through a chemical vapor deposition (CVD) process. Since masks are required during the CVD process and reaction gases diffuse to edges during the process, bottoms of side walls of the second inorganic layer will extend outward of the second inorganic layer (as shown by an enclosure 101 in dashed lines). The display portion 11 includes a switch array layer, an anode layer, an organic light-emitting layer, and a cathode, wherein a frame offset is designated as L.

Figure 2:
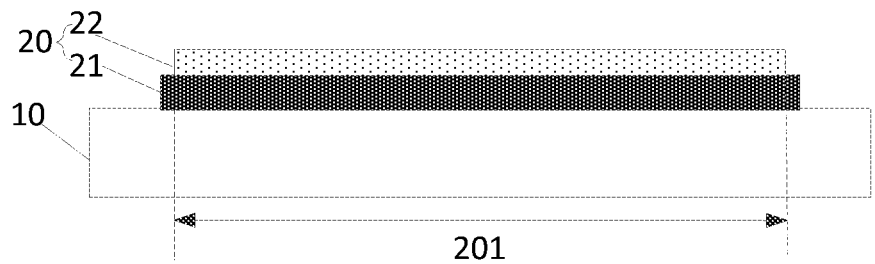
FIG. 2 is a schematic structural view according to a first step of a method of manufacturing a display panel of the present invention.

Please refer to FIGS. 2 to 8. FIG. 2 is a schematic structural view according to a first step of a method of manufacturing the display panel of the present invention.

A method of manufacturing a display panel in the embodiment of the present invention includes:

S101: fabricating a display portion on a glass substrate.

Specifically, as shown in FIG. 2, a display portion 20 is fabricated on a glass substrate 10, wherein the display portion 20 includes a switch array layer 21 and an organic light-emitting display layer 22. The switch array layer 21 includes a plurality of switch elements. The organic light-emitting display layer 22 includes an anode, an organic light-emitting layer, and a cathode layer. The display portion 20 may include a display area 201.

S102: forming a protection film on the glass substrate outside the display portion.

Figure 3:
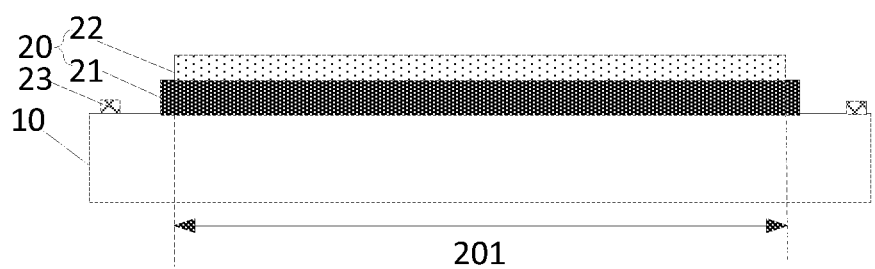
FIG. 3 is a schematic structural view according to a second step of the method of manufacturing the display panel of the present invention.
Figure 4:
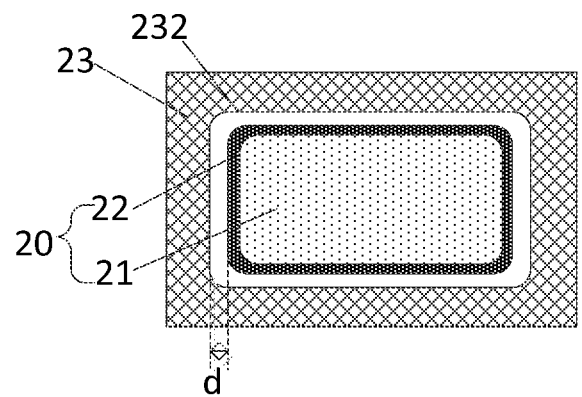
FIG. 4 is a top plan view according to the second step of the method of manufacturing the display panel of the present invention.
Figure 5:
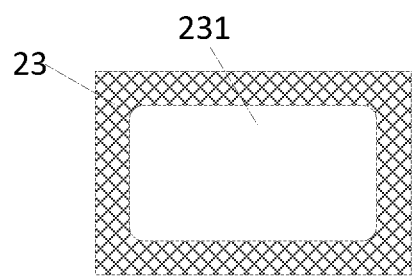
FIG. 5 is a top plan view of a protection film of the display panel of the present invention.

Specifically, as shown in FIGS. 3 to 5, a protection film 23 is adhered to the glass substrate 10 outside the display portion 20, wherein the protection film 23 has an opening 231, and the opening 231 accommodates the display portion 20. In one embodiment, the opening 231 has an area greater than that of the display portion 20. In one embodiment, as shown in FIG. 4, in order to further reduce a frame size, a distance d between an inner edge 232 of the protection film 23 and the display portion 20 is defined according to a predetermined frame width of the display panel. That is, the distance d between the inner edge 232 of the protection film 23 and the display portion 20 is defined according to an actual frame width of the display panel. Further referring to FIG. 1, in order to further reduce a frame width, a distance d between the inner edge 232 of the protection film 23 and the display portion 20 is defined according to a predetermined frame width of the display panel and the frame offset value L.

In one embodiment, in order to facilitate removal of the protection film, an adhesion force between the protection film 23 and the glass substrate 10 is less than a preset value. That is, the adhesion force between the protection film 23 and the glass substrate 10 is relatively small.

The protection film 23 is configured to block moisture and oxygen and to protect the glass substrate. Specifically, the protection film 23 protects the glass substrate from being damaged during a subsequent laser cutting process.

S103: forming an encapsulation film on the protection film and the display portion.

Figure 6:
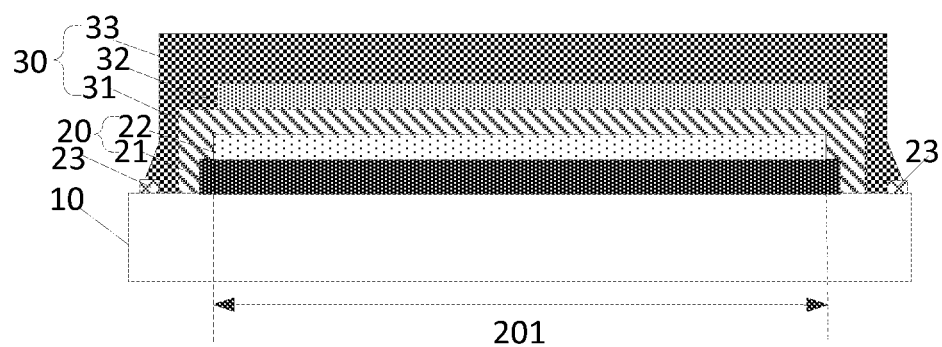
FIG. 6 is a schematic structural view according to a third step of the method of manufacturing the display panel of the present invention.

Specifically, as shown in FIG. 6, an encapsulation film 30 is formed on the protection film 23 and the display portion 20. In one embodiment, the encapsulation film 30 includes a first inorganic layer 31, an organic layer 32, and a second inorganic layer 33. The step specifically includes:

S1031: forming a first inorganic layer on the protection film and the display portion. Specifically, a first inorganic layer 31 is formed on the protection film 23 and the display portion 20, wherein the first inorganic layer 31 is made of a material including at least one of silicon nitride, silicon oxide, and aluminum oxide.

S1032: forming an organic layer on the first inorganic layer corresponding to the display area. Specifically, in one embodiment, an organic layer 32 is formed on the first inorganic layer 31 by inkjet printing, and a position of the organic layer 32 corresponds to a position of the display areas 201. That is, the organic layer 32 is disposed on the first inorganic layer 31 corresponding to the display area 201.

S1033: forming a second inorganic layer on the organic layer. Specifically, a second inorganic layer 33 is formed on the organic layer 32, wherein the second inorganic layer 33 covers the first inorganic layer 31. That is, the second inorganic layer 33 is disposed on the organic layer 32 and on the first inorganic layer 31 not covered by the organic layer 32. The second inorganic layer 33 may cover the first inorganic layer 31 and the organic layer 32. The second inorganic layer 33 is made of a material including at least one of silicon nitride, silicon oxide, and aluminum oxide. It can be understood that a structure of the encapsulation film is not limited to the above.

S104: obtaining a panel area by removing the protection film and the encapsulation film outside the predetermined limited area.

Figure 7:
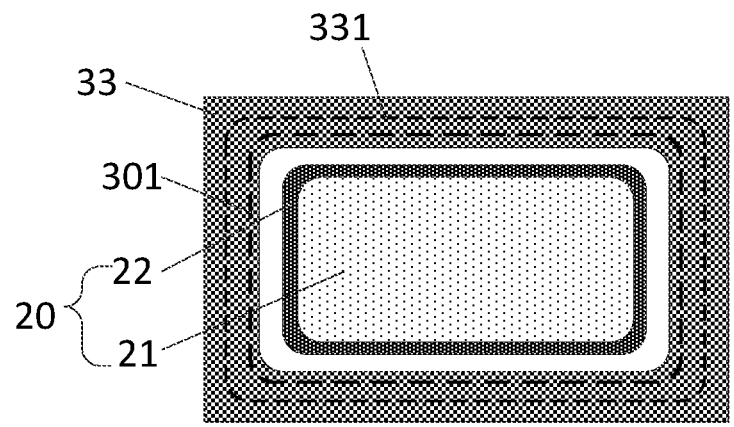
FIG. 7 is a schematic structural view according to a first sub-step of a fourth step of the method of manufacturing the display panel of the present invention.
Figure 8:
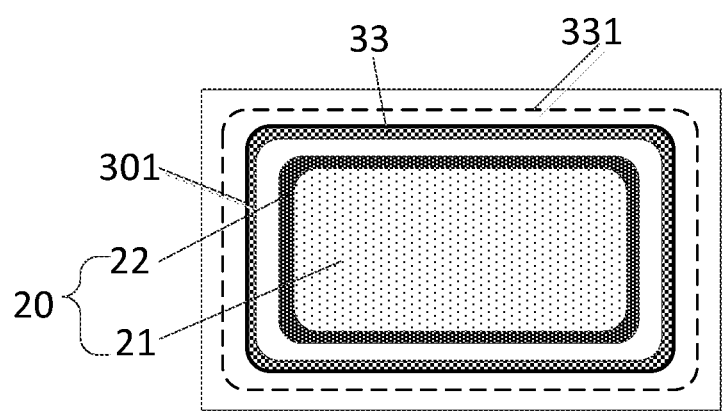
FIG. 8 is a top plan view according to a second sub-step of the fourth step of the method of manufacturing the display panel of the present invention.

Further referring to FIGS. 7 and 8, a predetermined limited area 301 is configured to define the panel area, that is, to limit a size of the panel area. The predetermined limited area 301 has an orthographic projection on the glass substrate 10 with an area greater than that of an orthographic projection of the display portion 20 on the glass substrate 10. The step specifically includes:

S1041: separating the protection film and the encapsulation film outside the predetermined limited area from the protection film and the encapsulation film in the predetermined limited area.

Specifically, as shown in FIG. 7, the protection film and the encapsulation film outside the predetermined limited area 301 are separated from the protection film and the encapsulation film in the predetermined limited area 301.

In one embodiment, the step may include:

S201: the protection film and the encapsulation film outside the predetermined limited area 301 on the glass substrate are separated from the protection film and the encapsulation film in the predetermined limited area 301 through a laser cutting method along a predetermined cutting line. A position of the predetermined cutting line corresponds to a position of an edge of the predetermined limited area 301. In one embodiment, the predetermined cutting line is located outside the opening 231, that is, an edge of the predetermined limited area 301 is located outside the opening 231. In another embodiment, further referring to FIG. 4, the predetermined cutting line is located on a boundary of the opening 231. That is, the predetermined cutting line overlaps the inner edge 232 of the protection film.

The laser cutting method can be implemented using a carbon dioxide (CO2) laser cutting machine.

S1042: peeling away the protection film and the encapsulation film outside the predetermined limited area.

Specifically, as shown in FIG. 8, the protection film and the encapsulation film outside the predetermined limited area 301 are peeled away to obtain a panel area. Then, a single panel can be obtained by cutting the panel area.

Since the protection film is firstly adhered to an area to be encapsulated (i.e. an area outside the display portion) prior to forming the encapsulation film, after formation of the encapsulation film, the panel area can be obtained by removing the protection film and the encapsulation film outside the predetermined limited area, thereby defining an film formation area of inorganic layers, and avoiding a problem of adversely affecting edge characteristics of OLED devices due to outward extending of edges of inorganic layers during conventional CVD processes, and further reducing a frame size of the display panel. In addition, manufacturing costs can also be reduced due to the use of masks is omitted.

A method of manufacturing a display panel of the present invention is implemented by fabricating a display portion on a glass substrate; adhering a protection film on the glass substrate outside the display portion, wherein the protection film has an opening and the opening accommodates the display portion; forming an encapsulation film on the protection film and the display portion; and obtaining a panel area by removing the protection film and the encapsulation film outside a predetermined limited area on the glass substrate, wherein the predetermined limited area corresponds to the display portion. Because a film formation area of inorganic layers is defined by adhering the protection film, outer edges of the inorganic layers can be prevented from expanding, thereby reducing a frame size of the display panel.

Accordingly, although the present invention has been disclosed as a preferred embodiment, it is not intended to limit the present invention. Those skilled in the art without departing from the spirit and scope of the present invention may make various changes or modifications, and thus the scope of the present invention should be after the appended claims and their equivalents.

What is claimed is:

1. A method of manufacturing a display panel, comprising:
    fabricating a display portion on a glass substrate;
    adhering a protection film on the glass substrate outside the display portion, wherein the protection film has an opening, the opening accommodates the display portion, and a distance between an inner edge of the protection film and the display portion is defined according to a predetermined frame width of the display panel;
    forming an encapsulation film on the protection film and the display portion;
    separating the entire protection film and the encapsulation film outside a predetermined limited area on the glass substrate from the protection film and the encapsulation film in the predetermined limited area along a predetermined cutting line, the predetermined cutting line overlapping the inner edge of the protection film; and
    obtaining, by peeling away the protection film and the encapsulation film outside the predetermined limited area, a panel area, wherein the predetermined limited area corresponds to the display portion.

2. The method of manufacturing the display panel of claim 1, wherein the protection film and the encapsulation film outside the predetermined limited area on the glass substrate are separated from the protection film and the encapsulation film in the predetermined limited area through a laser cutting method along the predetermined cutting line.

3. The method of manufacturing the display panel of claim 2, wherein the encapsulation film is provided with a predetermined offset boundary, and the predetermined cutting line is located inside the predetermined offset boundary.

4. The method of manufacturing the display panel of claim 1, wherein a distance between the inner edge of the protection film and the display portion is defined according to the predetermined frame width and a predetermined frame offset value of the display panel.

5. The method of manufacturing the display panel of claim 1, wherein an adhesion force between the protection film and the glass substrate is less than a preset value.

6. The method of manufacturing the display panel of claim 1, wherein a first inorganic layer is provided in the display panel, and the first inorganic layer is made of a material comprising at least one of silicon nitride, silicon oxide, and aluminum oxide.

7. A method of manufacturing a display panel, comprising:
    fabricating a display portion on a glass substrate;
    adhering a protection film on the glass substrate outside the display portion, wherein the protection film has an opening and the opening accommodates the display portion;
    forming an encapsulation film on the protection film and the display portion; and
    obtaining, by removing the entire protection film and the encapsulation film outside a predetermined limited area on the glass substrate along a predetermined cutting line, a panel area, wherein the predetermined cutting line overlaps an inner edge of the protection film, and the predetermined limited area covers the display portion.

8. The method of manufacturing the display panel of claim 7, wherein the removing of the entire protection film and the encapsulation film outside the predetermined limited area on the glass substrate along the predetermined cutting line comprises:
    separating the entire protection film and the encapsulation film outside the predetermined limited area from the encapsulation film in the predetermined limited area along the predetermined cutting line; and
    peeling away the protection film and the encapsulation film outside the predetermined limited area.

9. The method of manufacturing the display panel of claim 8, wherein the protection film and the encapsulation film outside the predetermined limited area on the glass substrate are separated from the protection film and the encapsulation film in the predetermined limited area through a laser cutting method along the predetermined cutting line.

10. The method of manufacturing the display panel of claim 9, wherein the encapsulation film is provided with a predetermined offset boundary, and the predetermined cutting line is located inside the predetermined offset boundary.

11. The method of manufacturing the display panel of claim 7, wherein a distance between the inner edge of the protection film and the display portion is defined according to a predetermined frame width of the display panel.

12. The method of manufacturing the display panel of claim 11, wherein a distance between the inner edge of the protection film and the display portion is defined according to the predetermined frame width and a predetermined frame offset value of the display panel.

13. The method of manufacturing the display panel of claim 7, wherein an adhesion force between the protection film and the glass substrate is less than a preset value.

14. The method of manufacturing the display panel of claim 7, wherein a first inorganic layer is provided in the display panel, and the first inorganic layer is made of a material comprising at least one of silicon nitride, silicon oxide, and aluminum oxide.

15. The method of manufacturing the display panel of claim 7, wherein the display portion comprises a switch array layer and an organic light-emitting display layer.

* * * * *